TRANSISTOR WITH ELONGATED BASE AND COLLECTOR CURRENT PATHS

Filed Aug. 23, 1962 2 Sheets-Sheet 1

INVENTOR.
Isy Haas.
BY
Flehr and Swain
ATTORNEY

Nov. 8, 1966 I. HAAS 3,284,677

TRANSISTOR WITH ELONGATED BASE AND COLLECTOR CURRENT PATHS

Filed Aug. 23, 1962 2 Sheets-Sheet 2

INVENTOR.
Isy Haas

BY

Flehr and Swain
ATTORNEYS.

3,284,677

TRANSISTOR WITH ELONGATED BASE AND COLLECTOR CURRENT PATHS

Isy Haas, Cupertino, Calif., assignor to Amelco, Inc., Los Angeles, Calif., a corporation of California
Filed Aug. 23, 1962, Ser. No. 218,971
9 Claims. (Cl. 317—235)

This invention relates generally to a transistor and more particularly to a transistor for use in direct coupled logic circuits.

Transistors having emitter, base and collector regions have been used in the prior art in direct coupled logic circuits. The designer of special transistors and semiconductive devices for this application is met with conflicting requirements.

The following are typical requirements for transistors used in direct coupled logic circuits:

(1) A very low collector saturation voltage ($V_{ce}$) so that the output voltage for the "on" condition is very small.

(2) A large difference between the collector saturation voltage ($V_{ce}$) and the base saturation vlotage ($V_{be}$).

(3) A high base impedance when the transistor is in saturation so that when several bases are connected in parallel, the base currents are almost equal and the transistors share the current. This is often referred to as "fan-out." If different transistors whose bases are connected in parallel draw substantially equal currents in each base, then the fan-out would be very close to the current gain ($\beta$) of the transistor.

(4) A final requirement is to maintain a large "fan-in" capability of the collectors of devices connected in parallel not to be effected by different loading conditions of the individual collectors.

In the prior art, transistors made for direct coupled logic circuits have included means for increasing the base input resistance. This is generally achieved by stretching the transistor geometry so as to make a relatively long current path between the base ohmic contact and the base-emitter junction. However, this does not work simply and efficiently as would appear upon first inspection. The high intrinsic base resistance is effectively lowered when the transistor goes into saturation because of the so-called "overlapping diode effect" (part of the base-collector junction acting as a forward biased diode to shunt the current). This effectively lowers the base input resistance as well as increasing the collector saturation voltage.

It is a general object of the present invention to provide an improved transistor device.

It is another object of the present invention to provide a four electrode semiconductor device or transistor for direct coupled logic circuits.

It is another object of the present invention to provide a transistor in which all ohmic connections may be made to one surface of the device thereby simplifying the micro-circuit design.

It is a further object of the invention to provide a transistor which generally meets all the requirements specified above for direct coupled transistor logic circuits (DCTL).

It is another object of the present invention to provide a transistor having high input impedance while maintaining a low collector saturation voltage.

It is still a further object of the present invention to provide a transistor having a high fan-out and a high fan-in in a direct coupled transistor logic circuit.

These and other objects of the invention will become more clearly apparent from the following description when taken in conjunction with the accompanying drawing.

Referring to the drawings.

Figure 1:
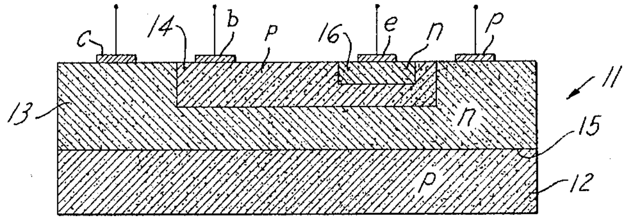
FIGURE 1 is a sectional view, taken generally along the line 1—1 of FIGURE 2, of a device in accordance with the present invention.
Figure 2:
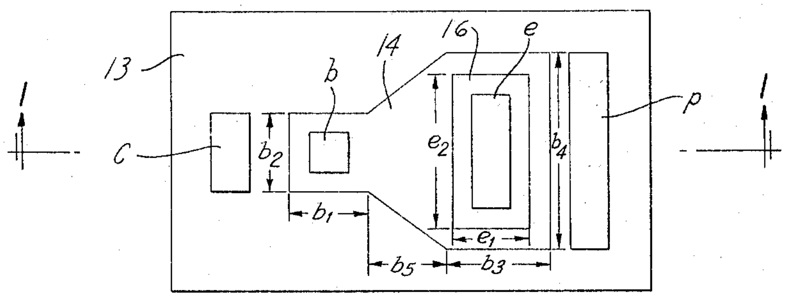
FIGURE 2 is a plan view of the device of FIGURE 1.

Referring to FIGURES 1 and 2, there is shown a transistor in accordance with the present invention. The transistor or semiconductor device illustrated includes a block of material 11 having a lower p-type support region 12 forming a p-n junction with an n-type region 13. The n-type region forms the collector region of the device as will be presently apparent. The block 11 may be cut from an ingot having grown junctions. Alternately, the junction may be formed by diffusion techniques or by epitaxial growth. The p-type region 12 serves as a support block for mounting the device. A plurality of devices may be mounted on a common block since they are isolated by the p-n junction 15. Further, a complete integrated circuit may be formed on the block.

A p-type base region 14 is inset into the collector region 13. Into the base region 14 is inset an n-type emitter region 16.

The techniques for forming inset regions in layers or regions of semiconductive material are well known in the art. Briefly, such techniques comprise the steps of suitably masking the surface into which the inset region extends; for example, with an oxide mask, forming a window in the mask, and predepositing and diffusing the inset region into the layer or region. Additional masking carried out with a properly positioned smaller window and another predeposition and diffusion provide the second inset region which is inset within the first inset region.

In accordance with the present invention, there are provided four ohmic contacts at the upper surface of the device. A first or collector contact *c* forms ohmic contact with the n-type collector region 13. A probe labelled *p* also makes ohmic contact with the n-type collector region 13. Ohmic base contact *b* is made with the inset p-type base region 14 and an ohmic emitter contact *e* is made with the inset emitter region 16.

Although the device has been described with particular conductivity type material for the various regions, it will be apparent to one skilled in the art that the conductivity type may be reversed since the concept of this invention is not restricted to a particular conductivity type material.

Figures 3, 6:
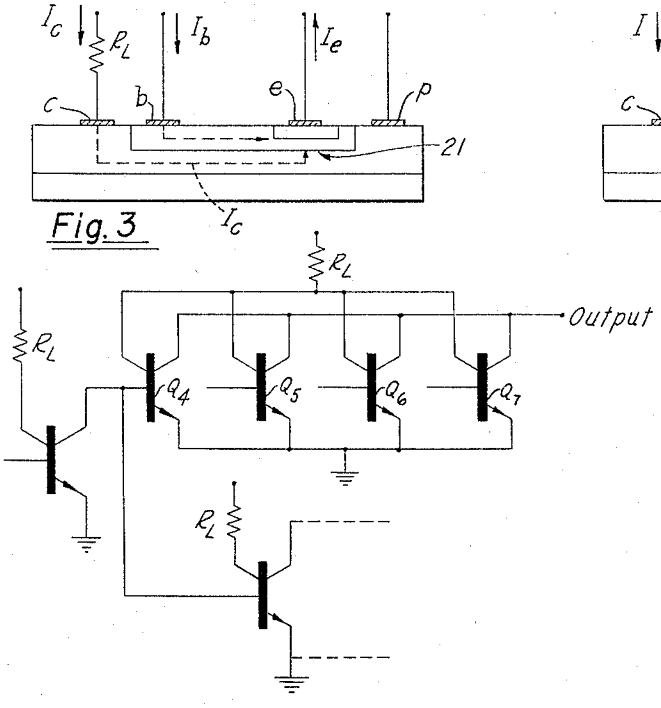
FIGURE 3 shows the flow of current when the device is "on"
FIGURE 6 shows a direct coupled logic circuit incorporating devices of the present invention.
Figure 4:
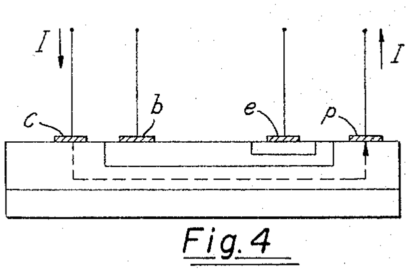
FIGURE 4 shows the flow of current when the device is "off"

Referring to FIGURES 3 and 4, the operation of the device is shown for the "on" and "off" conditions, respectively. In the "on" condition, FIGURE 3, the collector current flows through the load resistance $R_L$, through the collector region generally parallel to the base-collector junction, adjacent the base current path, and across the base-collector junction in the portion 21 opposite the emitter-base junction as indicated by the dotted arrow labelled $I_c$. The lower p-n junction allows the existence of an IR or lateral voltage drop in the collector region because this p-n junction essentially allows the collector region to float electrically. With the transistor in saturation, the voltage appearing between the emitter terminal and the probe is substantially equal to the difference between the collector base and the emitter-base junction voltage, $V_{ce}$. This is very close to the theoretical or classical collector-base junction saturation voltage since it is substantially independent of voltage drops in the collector bulk due to the collector current. On the other hand, the voltage at the collector *c* will be the sum of the voltages at the collector-base junction ($V_{ce}$) and the product of the current $I_c$ times the resistance $R_c$ which is the sheet resistance in the path through which the collector current $I_c$ flows to reach the portion at collector base junction under the emitter 21. This latter voltage drop can be as high as desired and can be controlled either by controlling the geometry of the device or the resistivity of the collector region or layer 13. This voltage drop is made higher than the minimum voltage required to maintain the portion of the collector-base junction, which is not under the emitter, reverse biased.

The base voltage $V_{be}$, on the other hand, will be equal to the emitter base voltage of the transistor in saturation plus the $I_bR_b$ voltage drop in the base where $R_b$ is the sheet resistance of the base.

The geometry of the collector and its resistivity is designed so that at a given operating current level, the collector voltage at *c* is equal to or larger than the base voltage at *b* which is the sum of emitter-base voltage when the transistor is saturated plus the $I_bR_b$ drop. As a result, a large portion of the collector-base junction will be reverse biased so that there will be no overlapping diode effect over this portion of the base-collector junction. The resistance of the base-emitter junction and the sheet resistance of the base can be controlled to obtain the desired high input resistance. The potential at the probe, *p*, will nevertheless be relatively low ($V_{ce}$) since the transistor is in saturation and this voltage is independent of the base resistance $R_b$, the collector current or the collector bulk resistance.

In the "off" condition, FIGURE 4, current will flow directly from the collector terminal, *c*, through the collector region 13 to the probe, *p*.

By way of illustration, the following is an example of the design of a semiconductor device in accordance with the invention. Assuming that the device is to have: (a) a beta ($\beta$) greater than ten, so that it definitely saturates when the collector current is equal to five times the base current; and (b) a base resistance of 300 ohms when it is saturated. It is known that typical base and collector voltages close to the emitter-base junction are 0.8 and 0.15 volts, respectively. If $I_b$ is 1 ma., $I_c$ will be equal to 5 ma. for saturation (a above). The base-emitter saturation voltage is equal to $V_{eb}+I_bR_p$ or $.8+1\times300\times10^{-3}$ or 1.1 volts. To avoid forward biasing of the base-collector junction outside the emitter area 21, the collector saturation voltage should be greater than .5 volt (1.1−0.6 volts, where 0.6 volt is the threshold voltage between low conductance and high conductance region of a forward biased silicon diode). In order to prevent the overlapping diode effect, the voltage drop $I_cR_c$ in the collector region must, therefore, be greater than .35 volt (.5−.15). Assuming the collector is $50\times10^{-4}$ cm. deep and the resistivity is 0.3 ohm cm., the collector sheet resistance is 60 ohms per square. To a first order of approximation, assuming that the current path from the collector is restricted mainly by the bulk under the base, this would correspond to 2.5 squares (assuming conventional transistor manufacturing techniques) to obtain an intrinsic base resistance of 300 ohms. The collector voltage drop $I_cR_c$ would, therefore, be .75 volt, Even allowing a factor of 2 in error in the calculations of the number of squares, the design would still be adequate to assure that the base-collector junction portion outside the emitter area remains reverse biased.

Devices were constructed in accordance with the foregoing in which the configuration was as shown in FIGURES 1 and 2, and the various regions identified above were as follows:

collector thickness=50 microns
base depth=6 microns
emitter depth=4.5 microns
$e_1$=4 mils
$e_2$=5 mils
$b_1$=4 mils
$b_2$=4 mils
$b_3$=6 mils
$b_4$=7 mils
$b_5$=4 mils Base=boron doped with surface concentration=$5\times10^{18}$
Emitter=phosphorus doped with surface concentration=$2\times10^{21}$
Collector=phosphorus doped with surface concentration=$2\times10^{21}$ The device was operated with $I_c$=5 ma.
$I_b$=1 ma.

Figure 5:
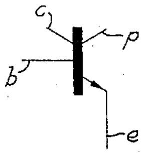
FIGURE 5 is a suggested symbol for the device of FIGURES 1 and 2.

And had the following characteristics at saturation $V_{ce}$ (probe)=0.10 volt
$V_{ce}$ (collector)=1.2 volts
$V_{be}$=1.2 volts
$R_b$=400 ohms Referring to FIGURE 5, there is shown a suggested symbol for the tetrode of the present invention.

Referring to FIGURE 6, there is shown the connection of a tetrode of the foregoing character in a worst case fan-out direct coupled logic circuit. It is seen from this circuit that because of the high base resistance, a plurality of devices connected in a fan-out circuit will share the current. The fan-in is illustrated in the upper part of the diagram by the devices $Q_4$–$Q_7$. When any one or more of the devices $Q_4$–$Q_7$ is on, it will not affect the loading of the other devices since the probe is floating. The output voltage will be substantially the saturation voltage of the collector probe at saturation.

Figure 7:
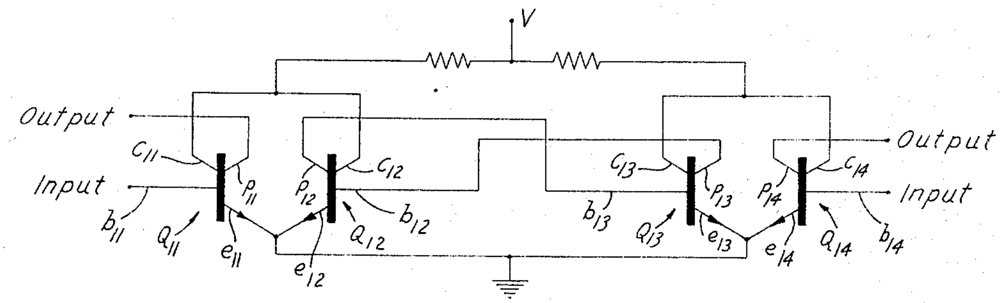
FIGURE 7 is a flip-flop circuit incorporating devices of the present invention.

FIGURE 7 shows two pairs of devices $Q_{11}$–$Q_{12}$ and $Q_{13}$–$Q_{14}$ connected in a flip-flop circuit having input terminals 21 and 22 connected to the bases of $b_{11}$, $b_{14}$ of each pair. The output is obtained at the probe of said one device of each pair, $p_{11}$, $p_{14}$. The collector $c_{11}$, $c_{14}$ of said one device of each pair is connected to the collector $c_{13}$, $c_{14}$ of the other device of each pair, respectively, and to a suitable voltage V through resistors $R_L$. The base $b_{12}$, $b_{13}$ of the other device of each pair is connected to the probe $p_{13}$, $p_{12}$ of the other device of the other pair. The emitters $e_{11}$, $e_{12}$, $e_{13}$, $e_{14}$ are connected in common.

Operation of the circuit is as follows: Assume that the voltage V is applied, then one of the transistors $Q_{12}$ or $Q_{13}$ will be turned on. The other will be turned off since its base is connected to the probe of the other. For the present discussion, assume that transistor $Q_{12}$ is on and transistor $Q_{13}$ is off. If a positive pulse is applied to the base $b_{11}$ of transistor $Q_{11}$, no switching will take place. However, if a positive pulse is applied to the base $b_{14}$ of transistor $Q_{14}$, it will be turned on lowering the collector and proble voltages $p_{14}$ and $c_{14}$ which, in turn, lowers the collector voltage $c_{13}$ of transistor $Q_{13}$ and, in turn, the proble voltage $p_{13}$. The probe $p_{13}$ is connected to the base $b_{12}$ of transistor $Q_{12}$, and the lowering of the voltage turns this transistor off. The collector voltage $c_{12}$ rises. The probe voltage $p_{12}$ rises and turns on the transistor $Q_{13}$. When the pulse is terminated, the transistor $Q_{13}$ remains on.

Figure 8:
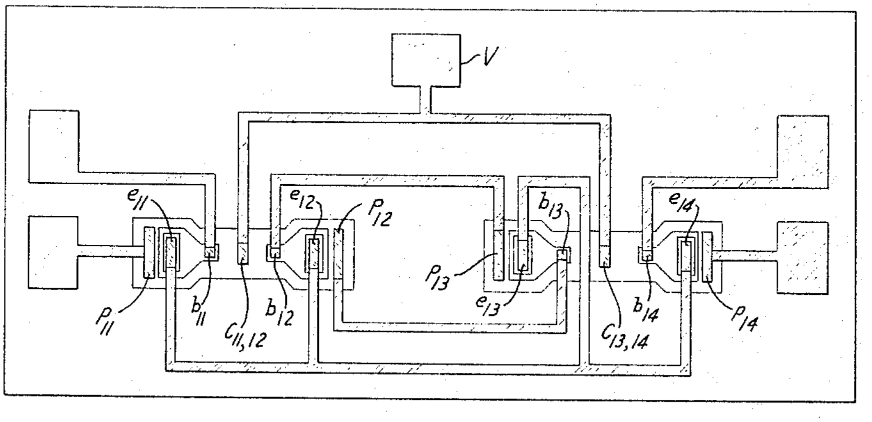
FIGURE 8 is a plan view of the circuit of FIGURE 7 as it might appear in integrated circuit form.

A plan view of the flip-flop circuit of FIGURE 7 in its integrated or microcircuit form is shown in FIGURE 8. The identification of the parts in FIGURE 8 corresponds to FIGURE 7 to simplify understanding the circuit. The interconnections may be, for example, evaporated metal leads carried by an oxide or other insulating layer. The oxide or insulating layer extends over the junction to prevent shorting of the same and includes windows for making ohmic contact to selected underlying regions.

It is to be observed that the device of the present invention is ideal for solid, integrated, microcircuit designs including logic circuits. This is, in part, due to the fact that the two collector contacts are on the same surface as the emitter and base junctions and topology of the interconnections becomes simplified.

I claim:

1. A transistor including a support region of one conductivity type, a collector region of oppoiste conductivity type having one surface forming a first junction with one surface of said support region, a base region of said one conductivity type inset into the collector region from the other surface to form a collector junction substantially parallel to said first junction, an emitter region of said one conductivity type inset into the base region from said other surface to form an emitter junction therewith, said emitter region being substantially smaller in area than the base region, ohmic contact formed with the emitter region, ohmic contact formed with the base region at a portion of the base region spaced from the emitter region to provide a base current path through the base region to the emitter junction which is substantially parallel to the collector junction, a pair of ohmic contacts formed with the collector region, one of said contacts being closely adjacent to the base contact whereby the collector current path is substantially parallel to the collector junction and the base current path and the other ohmic contact disposed on the other side of the emitter region.

2. A transistor as in claim 1 wherein the emitter region is offset on said base region to be closer to the portion of the collector region carrying said other ohmic contact.

3. A transistor as in claim 1 in which the semiconductive material in the base current path has high resistivity to provide a high base resistance.

4. A transistor as in claim 1 in which the collector current path has a resistance selected to provide a voltage drop in the portion of the collector adjacent the base such as to minimize the overlapping diode effect during operation.

5. A transistor as in claim 1 in which the collector resistance is such that during operation at a predetermined saturation current level the voltage at the collector is at least equal to the base voltage.

6. A transistor including a support region of one conductivity type, a collector region of opposite conductivity type having one surface forming a junction with one surface of the support region, a base region of said one conductivity type inset into the collector region from the other surface to form a collector junction therewith which extends to said other surface, an emitter region of said opposite conductivity type inset into the base region from said other surface to form therewith an emitter junction which extends to said other surface, said emitter region being subtsantially smaller in area than the base region and disposed closely adjacent to one portion of the collector junction extending to the surface, ohmic contact formed with the emitter region, ohmic contact formed with the base region at a portion of said surface spaced from the emitter region contact to provide a long base current path through the base region to the emitter junction, a pair of ohmic contacts formed on said surface with the collector region, one of said collector contacts being spaced closely adjacent to the base contact to thereby provide a collector current path which is substantially parallel to the base current path and the other of said contacts being disposed closely adjacent to the emitter region to probe the voltage between the emitter and collector.

7. A transistor as in claim 6 in which the resistance of the collector current path is selected to provide a voltage drop in the portion of the collector adjacent the base current path of such magnitude that the overlapping diode effect is minimized.

8. A transistor as in claim 7 in which the collector resistance is selected such that during operation at a predetermined saturation current level the voltage drop in the collector region is at least equal to the base voltage.

9. A semiconductor device including a collector region of one conductivity type, a base region of opposite conductivity type inset from one surface into said collector region to form a base-collector junction therewith, an emitter region of said one conductivity type inset from said one surface into the base region to form an emitter-base junction therewith, an ohmic emitter contact formed with said emitter, an ohmic base contact formed with said base on one side of said emitter region and spaced from the emitter-base junction to provide a long base current path which is substantially parallel to said base-collector junction, a first collector contact linearly connected to the collector region on said one side of the emitter region providing a relatively long collector current path generally parallel to the base current path, and a second collector contact ohmicly connected to the collector region on the other side of said emitter for measuring the voltage between the emitter and collector.

References Cited by the Examiner

UNITED STATES PATENTS

| | | | |
|---|---|---|---|
| 2,985,804 | 5/1961 | Buie | 317—235 |
| 2,993,154 | 7/1961 | Goldey | 317—235 |
| 3,029,366 | 4/1962 | Lehovec | 317—235 |
| 3,090,873 | 5/1963 | Mackintosh | 317—235 |

JOHN W. HUCKERT, *Primary Examiner.*

JAMES D. KALLAM, *Examiner.*